(12) United States Patent
Bhat et al.

(10) Patent No.: US 12,191,870 B2
(45) Date of Patent: Jan. 7, 2025

(54) CLOCK JITTER AND SPURIOUS TONE CANCELLATION SYSTEM USING OPTICAL DELAY

(71) Applicant: Cisco Technology, Inc., San Jose, CA (US)

(72) Inventors: Abhishek Bhat, Allentown, PA (US); Sujit Handanhal Ramachandra, Allentown, PA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 52 days.

(21) Appl. No.: 18/162,091

(22) Filed: Jan. 31, 2023

(65) Prior Publication Data

US 2024/0259025 A1 Aug. 1, 2024

(51) Int. Cl.
 H03L 7/107 (2006.01)
 H01S 3/13 (2006.01)
 H03L 7/081 (2006.01)

(52) U.S. Cl.
 CPC .............. *H03L 7/1075* (2013.01); *H01S 3/13* (2013.01); *H03L 7/0818* (2013.01)

(58) Field of Classification Search
 CPC ....... H03L 7/1075; H03L 7/0818; H01S 3/13; H04B 10/158
 USPC ....... 331/1 R; 372/26, 25, 94, 18, 30, 29.02, 372/29.011; 359/279; 332/103, 104; 375/295
 See application file for complete search history.

(56) References Cited

U.S. PATENT DOCUMENTS

| | | | |
|---|---|---|---|
| 6,359,487 B1 | 3/2002 | Heightley et al. | |
| 11,398,827 B1 | 7/2022 | Bhat et al. | |
| 11,575,436 B1 * | 2/2023 | Seeger | H04B 10/25759 |
| 2002/0159668 A1 * | 10/2002 | Williams | G02F 1/225 385/3 |
| 2008/0080870 A1 | 4/2008 | Tsuji | |
| 2019/0280774 A1 * | 9/2019 | Nazarathy | G02B 6/29302 |

FOREIGN PATENT DOCUMENTS

| | | | |
|---|---|---|---|
| EP | 1052792 A2 | 11/2000 | |
| EP | 1816763 A1 * | 8/2007 | G02F 1/0123 |
| JP | 2005222083 A | 8/2005 | |
| JP | 2006049967 A | 4/2007 | |

OTHER PUBLICATIONS

Zhou Zhenghua, Yang Chun, Cao Zhewei, Chong Yuhua, L. Xianghua less Published in IEEE Photonics Technology . . . Feb. 15, 2016 Engineering, Physics (Year: 2016).*

(Continued)

*Primary Examiner* — Arnold M Kinkead
(74) *Attorney, Agent, or Firm* — Edell, Shapiro & Finnan, LLC

(57) ABSTRACT

Techniques to reduce or eliminate phase noise and jitter from a noisy clock signal. A method includes generating an electrical clock signal, generating a delayed optical clock signal based on the electrical clock signal, detecting a phase difference between the electrical clock signal and the delayed optical clock signal, and processing, based on the phase difference, the electrical clock signal to obtain a reduced phase noise version of the electrical clock signal.

20 Claims, 16 Drawing Sheets

(56) References Cited

OTHER PUBLICATIONS

Shravan S. Nagam, et al., "A -236.3dB FoM Sub-Sampling Low-Jitter Supply-Robust Ring-Oscillator PLL for Clocking Applications with Feed-Forward Noise-Cancellation," IEEE Xplore, 2017 IEEE Custom Integrated Circuits Conference (CICC), 2017, 4 pages.
Seungkee Min, et al, "A 90-nm CMOS 5-GHz Ring-Oscillator PLL With Delay-Discriminator-Based Active Phase-Noise Cancellation," IEEE Xplore, IEEE Journal of Solid-State Circuits, vol. 48, No. 5, May 2013, 10 pages.
Alireza Imani, et al., "A Low-Noise FBAR-CMOS Frequency/Phase Discriminator forPhase Noise Measurement and Cancellation," IEEE Xplor, 2013 IEEE Radio Frequency Integrated Circuits Symposium, RTUIF-8, 2013, 4 pages.
Kai Wei, et al., "Hybrid Modeling and Design Optimization of Chip Level of us Long Optical Delays for Realization of Integrated Optoelectronic Circuits," Progress In Electromagnetics Research, vol. 172, 2021, 12 pages.
Yurii A. Vlasov, et al., "Coupling into the slow light mode in slab-type photonic crystal waveguides," Optics Letters, Feb. 2, 2008, 3 pages.
S. Hadi Badri, et al., "Coupling Silica Waveguides to Photonic Crystal Waveguides Through Multilayered Luneburg Lens," Optica Publishing Group, Dec. 17, 2019, 13 pages.
S A Schulz, "Dispersion engineered slow light in photonic crystals: a comparison," Journal of Optics, Sep. 24, 2010, 10 pages.

* cited by examiner

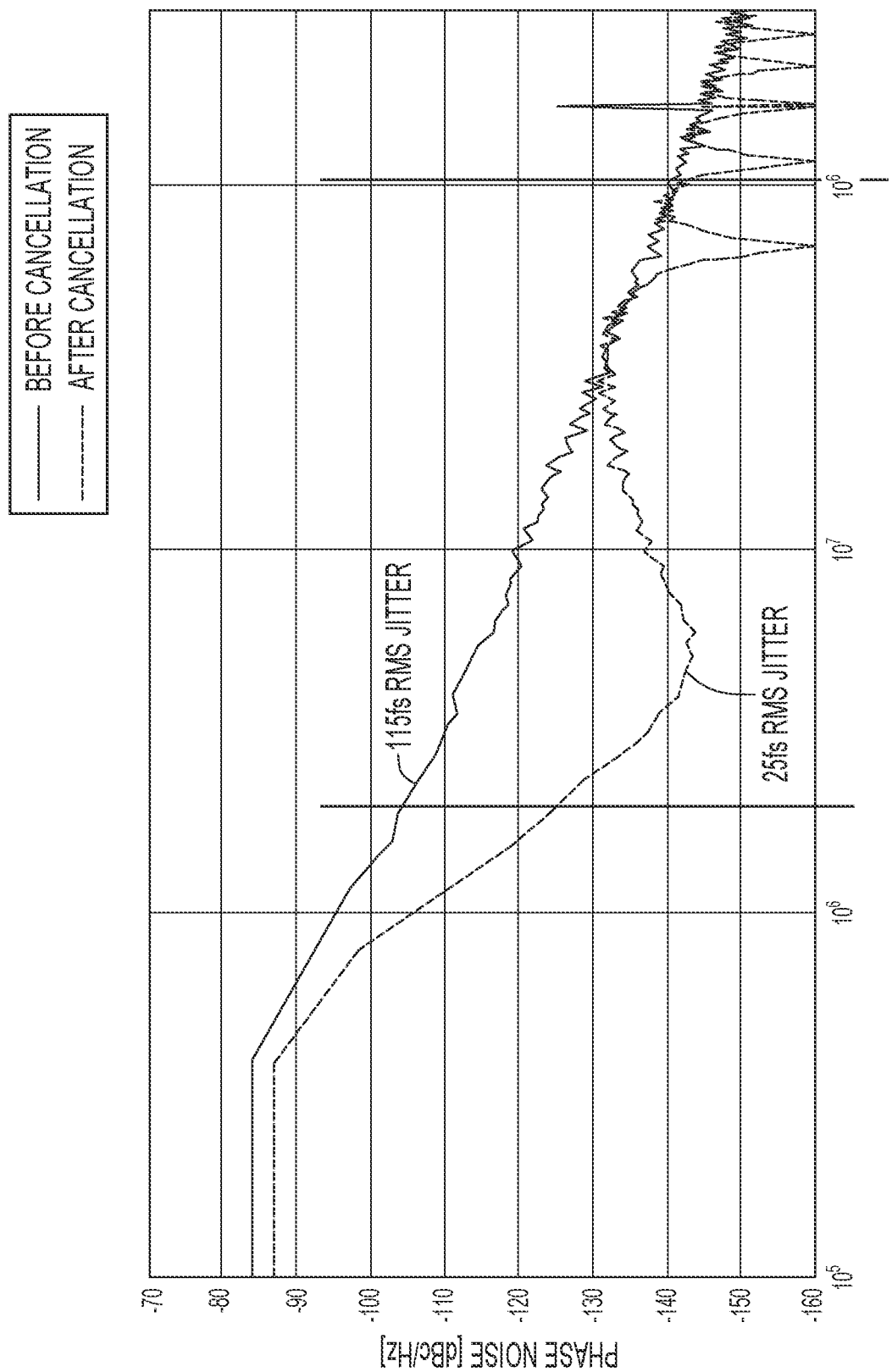

CLOCK JITTER AND SPURIOUS TONE CANCELLATION SYSTEM USING OPTICAL DELAY

TECHNICAL FIELD

The present disclosure relates to reducing or eliminating jitter and spurious tones from a clock signal used, e.g., for an optical transceiver for network communications.

BACKGROUND

The desire for higher data rates in both wireline and wireless communication systems often leads to design challenges for clocking circuits.

For example, low jitter/low phase noise clocks are desired to reduce error due to small timing margins at, e.g., in 200G (and beyond) data rates. Unfortunately, spurious tones in the clock signal as a result of, e.g., on-chip coupling, reference clock leakage, etc., degrade jitter. Techniques to reduce phase noise in high-frequency phase locked loops (PLLs) include using a higher reference clock frequency or implementing, what is often, a power-hungry on-chip LC oscillator. Unfortunately, the higher reference clock frequency increases system cost, and the on-chip LC oscillator reduces system power efficiency. Thus, neither technique is particularly desirable.

Ultra-low noise test clocks are also useful for testing and measurement in high-speed wireline systems, as well as in mm-wave 5G-and-beyond wireless systems. However, for these applications, bulky and high-power consumption clock sources are often implemented, and are thus also undesirable.

BRIEF DESCRIPTION OF THE DRAWINGS

FIG. 8B is a graph comparing phase noise of an LC oscillator-based PLL before and after noise cancellation, according to an example embodiment.

DETAILED DESCRIPTION

Overview

Figure 1:
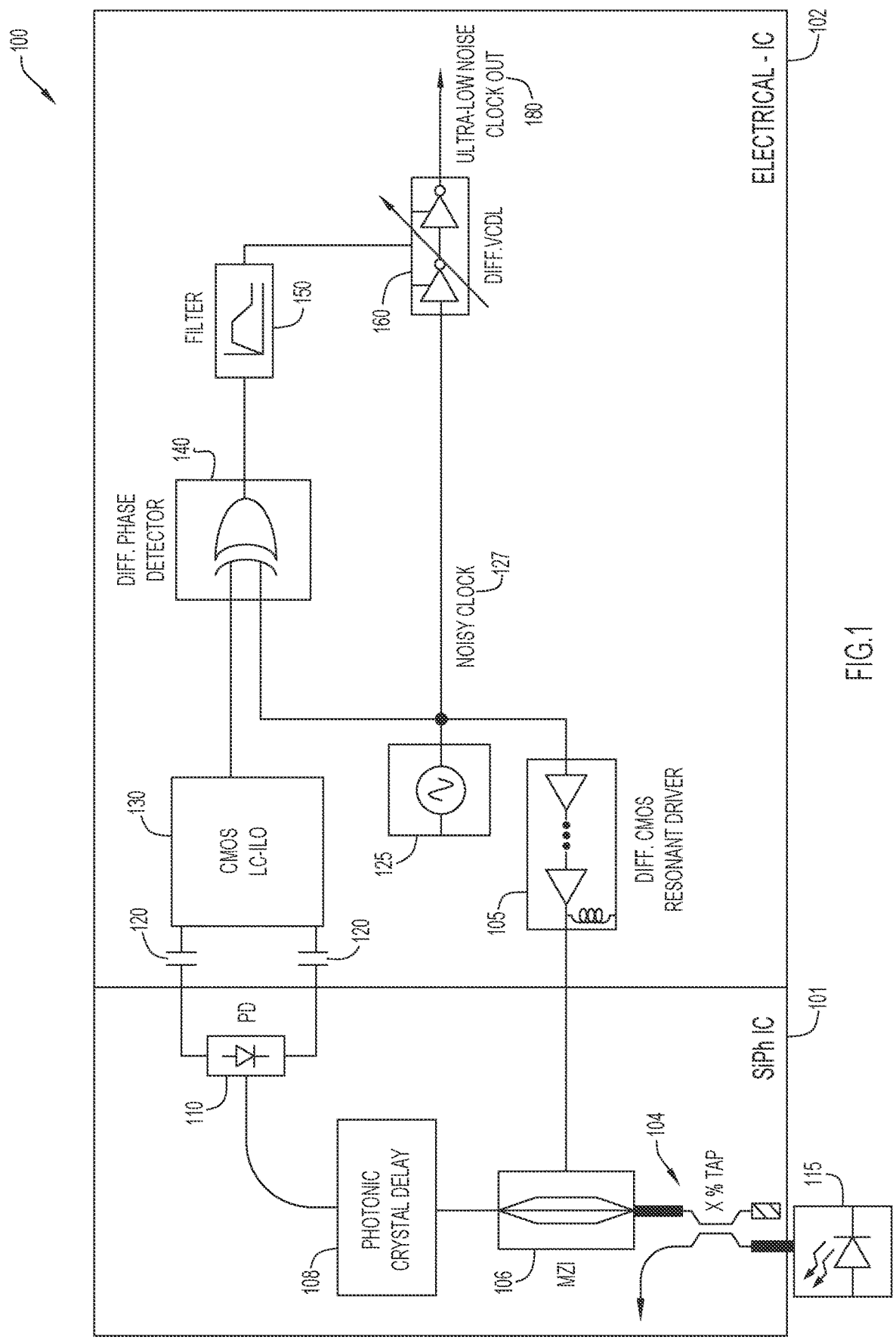
FIG. 1 shows an electro-optical phase noise cancellation system, according to an example embodiment.

Techniques to reduce or eliminate phase noise and jitter from a noisy clock signal are presented. A method includes generating an electrical clock signal, generating a delayed optical clock signal based on the electrical clock signal, detecting a phase difference between the electrical clock signal and the delayed optical clock signal, and processing, based on the phase difference, the electrical clock signal to obtain a reduced phase noise version of the electrical clock signal.

In another embodiment, another method includes generating a clock signal, modulating an optical signal based on the clock signal to obtain a modulated optical signal, delaying the modulated optical signal to obtain a delayed modulated optical signal, converting the delayed modulated optical signal to an electrical signal, detecting a phase difference between the electrical signal and the clock signal, and processing, based on the phase difference, the clock signal to obtain a reduced phase noise version of the clock signal.

In yet another embodiment, a device is provided. The device includes a clock configured to generate a clock signal, an optical modulator configured to modulate an optical signal based on the clock signal to obtain a modulated optical signal, an optical delay configured to delay the modulated optical signal to obtain a delayed modulated optical signal, a photo detector configured to convert the delayed modulated optical signal to an electrical signal, a phase detector configured to detect a phase difference between the electrical signal and the clock signal, and a voltage controlled delay line configured to process, based on the phase difference, the phase of the clock signal to obtain a reduced phase noise version of the clock signal.

Example Embodiments

The noise cancellation techniques described herein provide a novel phase detection and noise cancellation electro-optical system using an optical delay. Instead of achieving relatively large delays for phase noise cancellation using a "delay-discriminator" in the electrical domain that often degrades jitter, the present embodiments rely on an optical delay to compensate for a noisy clock signal. In one implementation, a photonic crystal-based optical delay line is employed to achieve large delays with ultra-low noise clocks.

In an embodiment, the photonic crystal is fed an optical signal that has been modulated by a Mach-Zehnder Interferometer (MZI), which is driven by a low-power resonant-CMOS driver, which itself is driven by a noisy clock signal (which is to be processed to reduce phase noise). An output of the photonic crystal is supplied to a photo-diode and an output of the photo-diode is supplied to a low-power transimpedance amplifier (TIA) based on the injection-locking principle to amplify the clock signal. An output of the low-power TIA is supplied to a phase detector, which also receives the noisy clock signal. An output voltage of the phase detector is scaled and filtered, and then supplied to a voltage-controlled delay line, which processes the phase of the noisy clock signal to generate an ultra-low noise clock signal.

By implementing the electro-optical system described herein, ultra-low phase noise clocks with low spurious tones can be generated. Notably, the system can be implemented without much power penalty in an electro-optical system using silicon-photonics fabrication processes.

Reference is now made to the figures, beginning with FIG. 1, which shows an electro-optical phase noise cancellation system or, more simply, system 100, according to an example embodiment. As shown, system 100 includes a silicon photonics integrated circuit, or SiPh IC 101, and an electrical IC 102. SiPh IC 101 includes an optical tap, 104, an MZI 106, photonic crystal delay 108, although other photonic delays could be implemented, and photo-detector, or PD 110.

Electrical IC 102 includes DC blocking capacitors 120 (although such capacitors could also be implemented in SiPh IC 101), a transimpedance amplifier, in this case implemented as a CMOS LC injection locked oscillator, or LC-ILO 130, a differential phase detector 140, which, in an embodiment, may be implemented with XOR logic, a filter 150, e.g., an inverse filter, a clock 125, and a differential voltage-controlled delay line, or differential VCDL 160. Although differential components are described and depicted in the drawings, single-ended components may also be implemented for the embodiments described herein.

As shown, tap 104 taps a predetermined amount (i.e., a percentage, %) of optical power from a light source 115, such as a laser whose light may be used for other functions in an optical communications system. An output of tap 104 is supplied to MZI 106, which is modulated by resonant driver 105, based on noisy clock 127 generated by clock 125. An output of MZI 106 is supplied to photonic crystal delay 108. An output of photonic crystal delay 108 is supplied to PD 110, and an output of PD 110 is supplied, via DC blocking capacitors 120 (which may also be referred to as AC coupling capacitors), to LC-ILO 130.

An output of LC-ILO 130 is supplied to differential phase detector 140. The output of clock 125, i.e., noisy clock 127, is also supplied to differential phase detector 140. An output of differential phase detector 140 is supplied to filter 150, and an output of filter 150 is supplied to VCDL 160. Noisy clock 127 is also supplied to differential VCDL 160, and further drives resonant driver 105.

As can be seen from FIG. 1, an ultra-low noise clock out 180 is generated for noisy clock 127 by processing the noisy clock 127 through VCDL 160, which is controlled by the filtered output of the differential phase detector 140.

Figure 2:
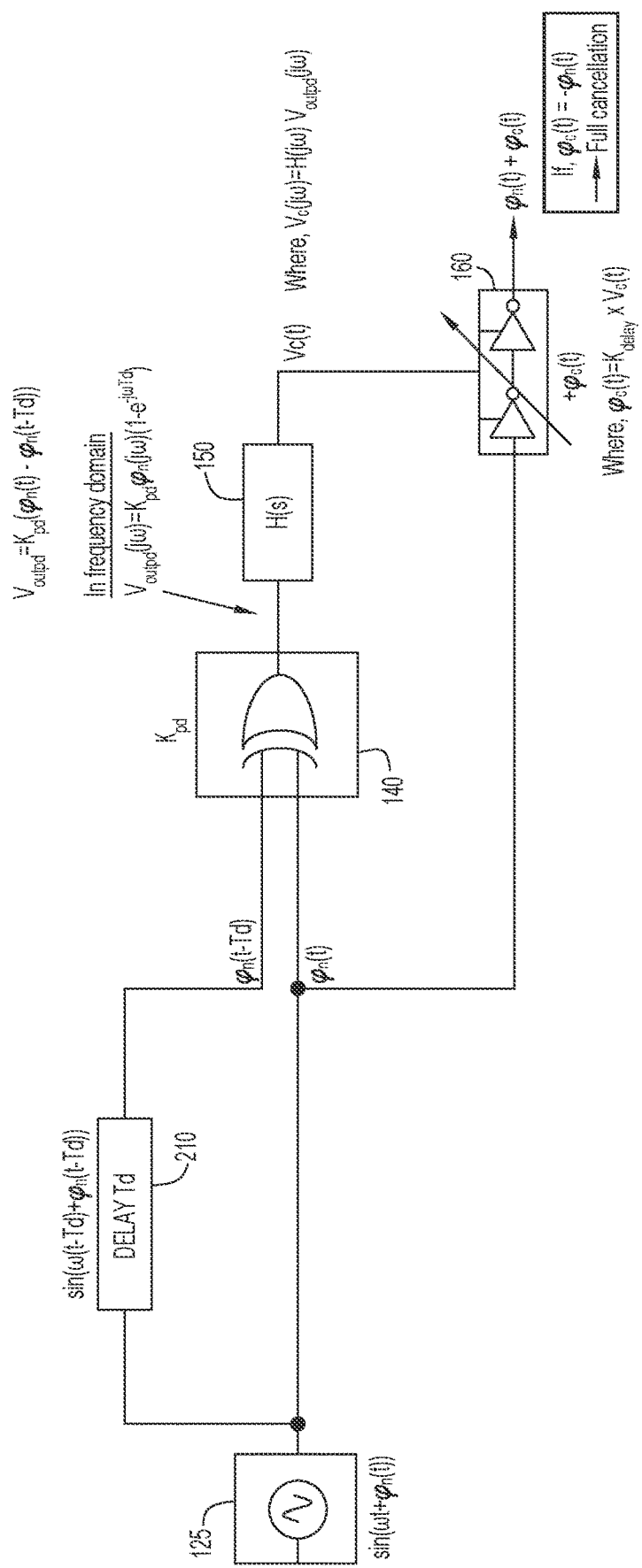
FIG. 2 illustrates the principle of operation of the electro-optical phase noise cancellation system, according to an example embodiment.

FIG. 2 illustrates the principle of operation of the electro-optical phase noise cancellation system, according to an example embodiment. As shown, clock 125 supplies its noisy clock 127 whose phase noise in the time domain is represented as $\varphi_n(t)$, and an optically-delayed version of noisy clock 127 with a time domain phase noise of $\varphi_n(t-Td)$ (represented by delay Td 210), to differential phase detector 140. The clock signal at the output of the delay may be represented as $\sin(\omega(t-Td)+\varphi_n(t-Td))$. Differential phase detector 140 has a gain of $K_{pd}$.

As such, an output of differential phase detector 140 may be represented, in the time domain, as $V_{outpd}=K_{pd}(\varphi_n(t)-\varphi_n(t-Td))$, and equivalently, in the frequency domain, as $V_{outpd}(j\omega)=K_{pd}\varphi_n(j\omega))(1-e^{-j\omega Td})$. An output of differential phase detector 140 is supplied to filter 150, which has a transfer function H(s).

An output of filter 150 may be represented as $V_c(t)$, where $V_c(j\omega)=H(j\omega) V_{outpd}(j\omega)$.

$V_c(t)$ is supplied to VCDL 160, which adds a time varying phase of $+\varphi_c(t)$, where $\varphi_c(t)=K_{delay} \times V_c(t)$ If, $\varphi_c(t)=-\varphi_n(t)$, then full phase noise cancellation is achieved.

In the expression, $V_{outpd}(j\omega)=K_{pd}\varphi_n(j\omega)(1-e^{-j\omega Td})$, $(1-e^{-j\omega Td})$ has a maximum gain of 2 at $\omega=(2n+1)\pi/Td$. Hence, if $K_{pd} \times |H(j\omega)| \times K_{delay}=-\frac{1}{2}$, $\varphi_c(t)=-\varphi_n(t)$, perfect cancellation is achieved at $\omega=(2n+1)\pi/Td$.

For low a frequency, i.e., if f<<1/Td, $1-e^{-sTd} \approx sTd$. Thus, for a low frequency, if H(s)=-1/sTd, and $K_{pd} \times K_{delay}=1$, then $\varphi_c(t)=-\varphi_n(t)$, leading to perfect phase noise cancellation. Thus, if $K_{delay}$ is designed to be $1/K_{pd}$ and the transfer function H(s) of filter 150 is designed such that it is −1/sTd at low frequencies and −½ at $\omega=(2n+1)\pi/Td$, then the phase added by the delay line $\varphi_c(t)$ will be equal to $-\varphi_n(t)$. As such, good phase noise cancellation can be achieved if Kpd, Kdelay, and H(s) meet these conditions.

Several of the components depicted in FIG. 1 are now described in more detail. Specifically, described are the optical delay, an inverse electrical filter with transfer function H(s), a low-power injection-locked TIA, MZI and it's low-power resonant CMOS driver, and the phase detector.

Figure 3A:
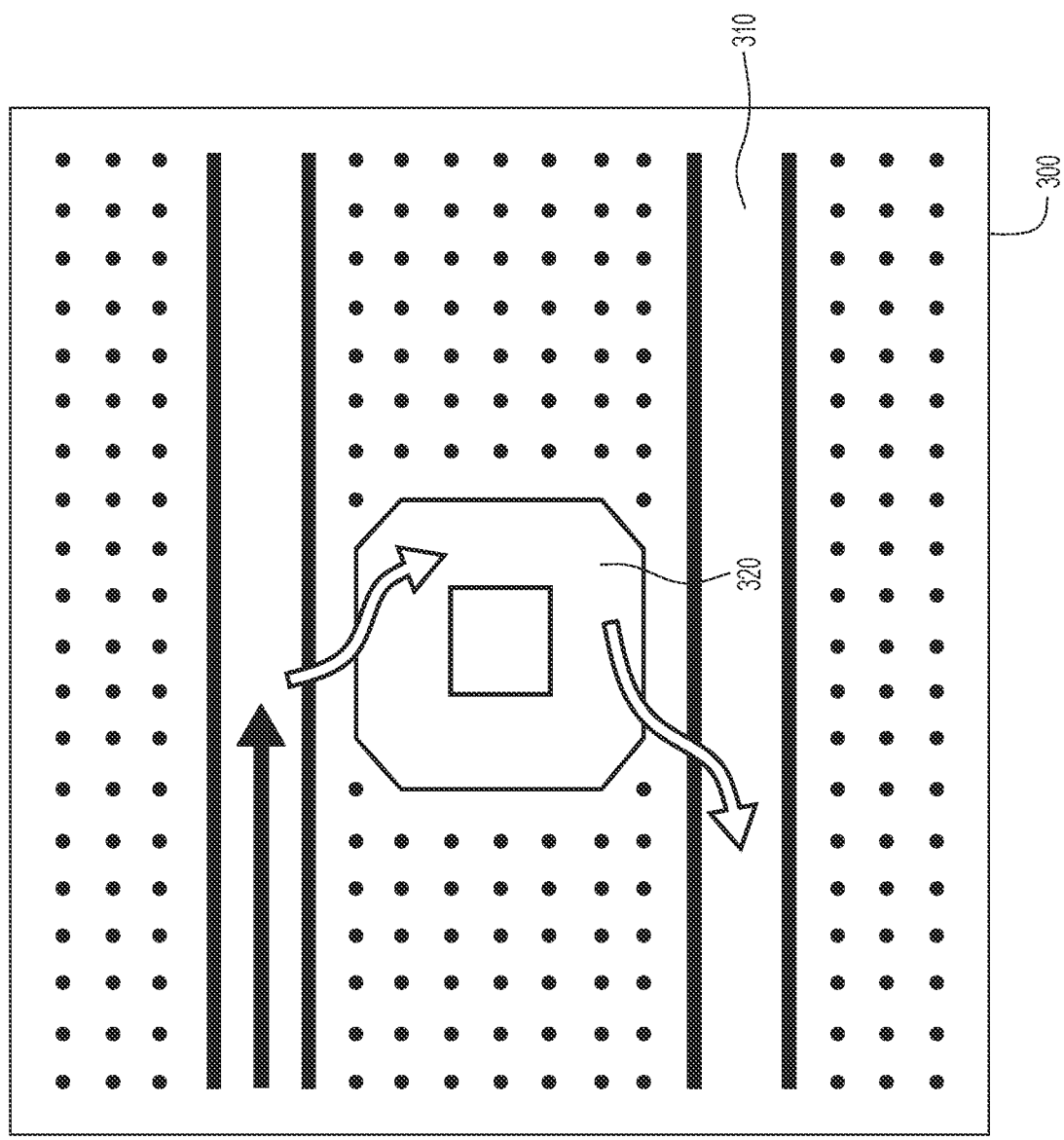
FIG. 3A is an example of a photonic crystal resonator that may be used in the electro-optical phase noise cancellation system, according to an example embodiment.

In the phase noise reduction techniques described herein, delays in the range of 10 s of ns are desirable for good low-frequency noise cancellation (<10 MHz). FIG. 3A is an example of a photonic crystal resonator that may be used to achieve such a delay. As depicted, a photonic crystal resonator 300, in the form of an add-drop photonic crystal filter, may be configured with a set of dielectric rods uniformly distributed in a cladding (e.g., SiO2/Air). Example dimensions may be, e.g., 100 nm diameter with a lattice constant of 500 nm.

Figure 3B:
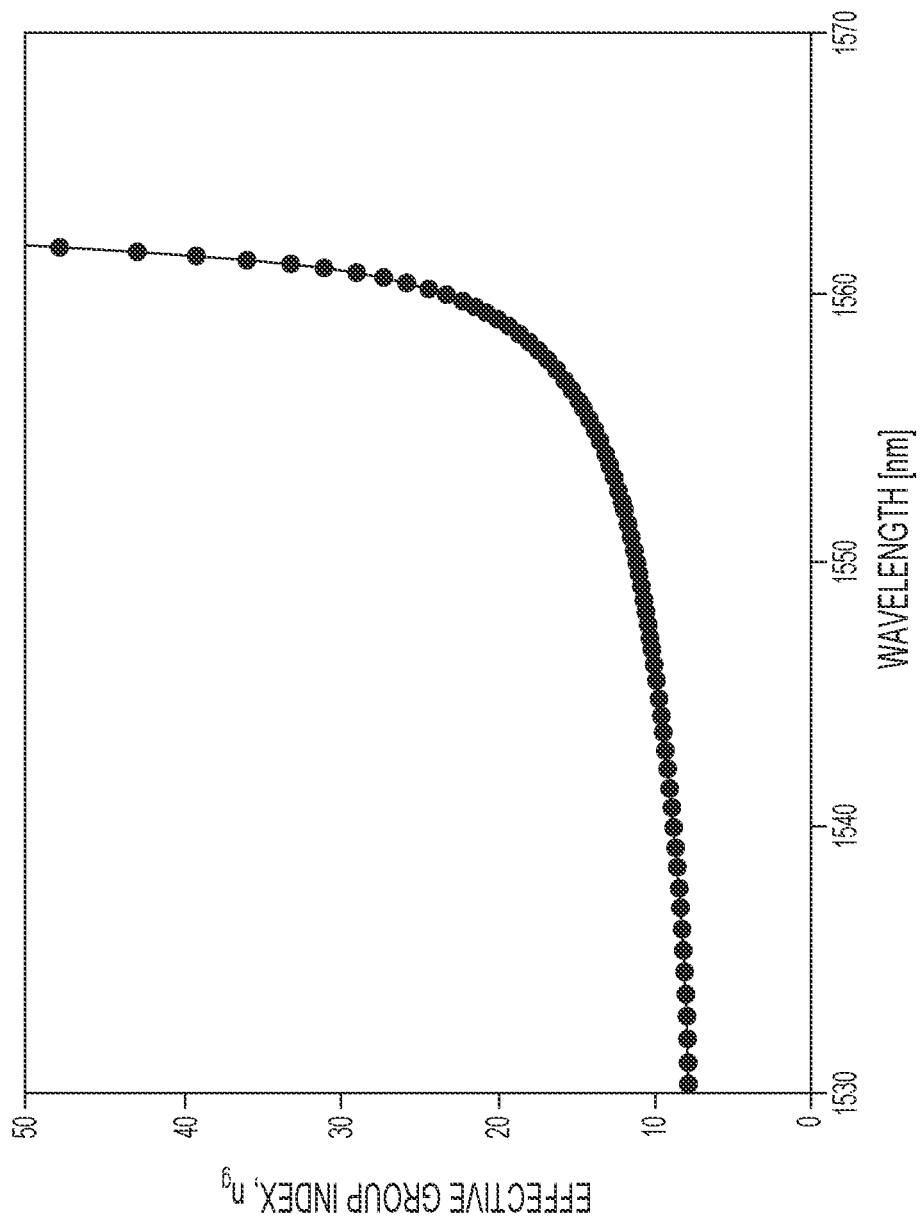
FIG. 3B is a graph depicting effective group delay for the photonic crystal resonator of FIG. 3A, according to an example embodiment.
Figure 4:
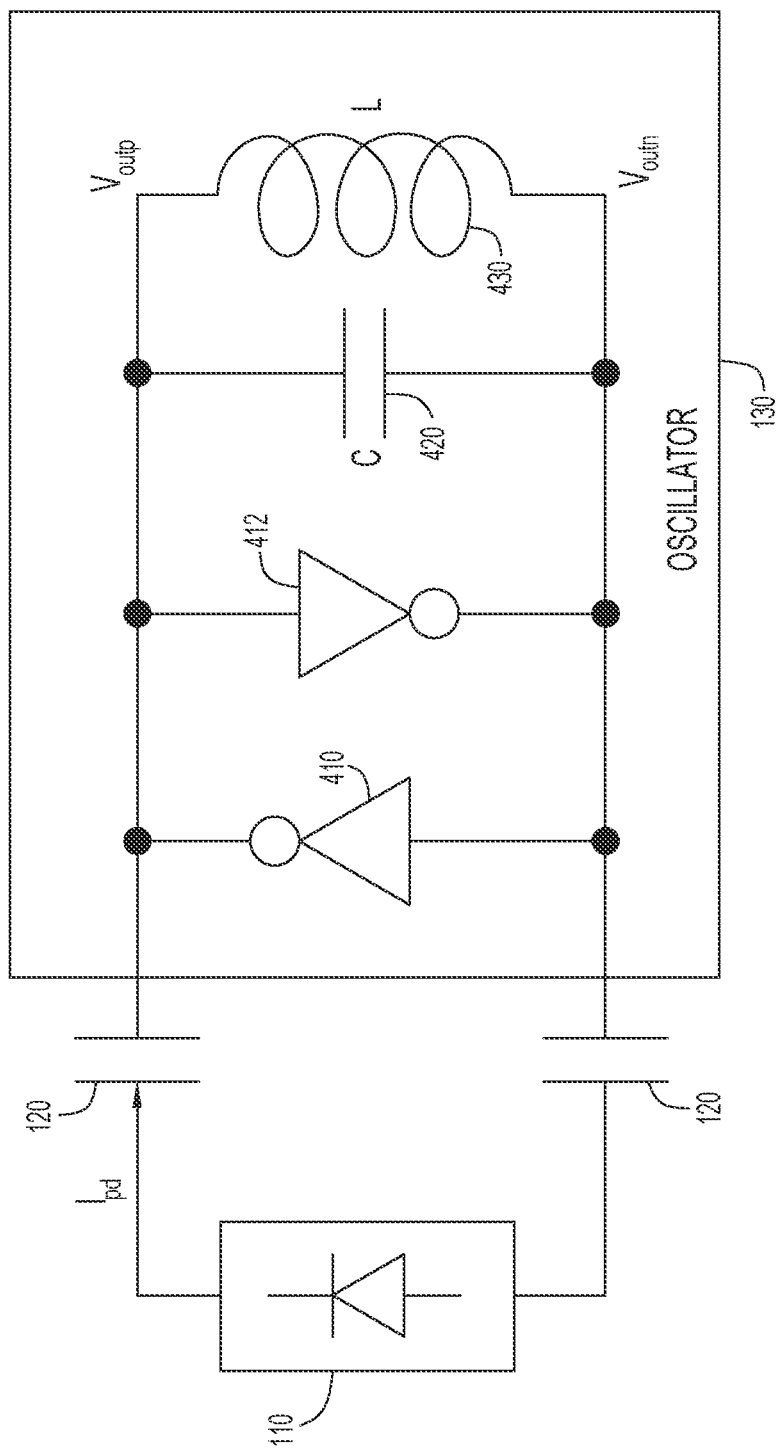
FIG. 4 shows an injection locked oscillator that may be used in the electro-optical phase noise cancellation system, according to an example embodiment.

Defects in the photonic crystal resonator 300 act as waveguides 310. As shown, a resonant ring 320 may also be formed. When designed to operate at wavelengths close to the photonic band edge, the group index of the propagating mode increases as shown in FIG. 3B. Large group index implies a lower group velocity. This manifests as a time delay between an input port and an output port. The lattice constant, fill, and ring radius are tuned for the operating wavelength to operate with both resonance and slow-light effects.

A single photonic crystal resonator 300 may exhibit a delay on the order of 200 ps @ 1550 nm. There are two ways to scale the delay to 10 s or 100 s of ns. First, the resonant ring 320 may be fabricated with a larger radius, or, second, multiple ones of the photonic crystal resonator 300 may be cascaded in an add-drop filter configuration. In accordance with one possible implementation, a 25 ns delay may be achieved with a ring radius of 200 μm with only 0.06 dB optical loss.

In an embodiment, the transfer function H(s) of filter 150 may be a band pass filter with good gain at the frequency of interest (e.g., >1 MHz). A lower order filter with response close to ideal $1/(1-e^{-sTd})$ is desirable. One such realizable H(s) is:

$$\text{Realized } H(s) = \frac{s\left(1 + \frac{s}{\omega_{z1}}\right)}{\left(1 + \frac{s}{\omega_{p1}}\right)\left(1 + \frac{s}{\omega_{p2}}\right)\left(1 + \frac{s}{\omega_{p3}}\right)}$$

Such a filter can be realized using a combination of active components including Operational Amplifiers (Op-amps) and passive components such as resistors and capacitors. Example analog filter architectures to implement such transfer functions are biquad filters, Rauch filters, Sallen-Key filters, etc. More complex and higher order filters can be easily implemented in the digital domain. In this regard, an analog-to-digital converter (ADC) can be used to convert the analog voltage at the output of the phase detector 140. H(s) can be implemented in digital domain and the digital output can be used to control a digitally controlled delay line (DCDL), describer further below in connection with FIG. 7.

FIG. 5 shows an injection locked oscillator, or LC-ILO 130, that may be used in the system 100, according to an example embodiment. Since the TIA in this use case is arranged to receive a clock signal, it can be configured as a resonant circuit, and may be configured to have high gain at the clock frequency, e.g., 14 GHz (or other frequency such as 28 GHz, 56 GHz, etc.). In this regard, an injection locking oscillator provides very high gain. As shown, LC-ILO 130 includes cross coupled inverters 410, 412, a capacitor 420, and inductor 430. A differential output comprising Voutp and Voutn is supplied to differential phase detector 140. Parasitic capacitance of the PD 110 resonates with the inductor 430 of LC-ILO 130. As noted earlier, this component may also be implemented as a single-ended component.

The ILO-based TIA can provide very high gain with low DC current. In one implementation, gain as high as 78 dBΩ can be achieved with a single stage of the described ILO with only 5 mA of bias current. Also, the disclosed LC-ILO 130 exhibits a low phase noise floor of −145 dBc/Hz beyond 100 kHz offset, and it has a jitter tracking bandwidth of 500 MHz with an open loop Q of 2.5. The example implementation may be realized with, e.g., L=650 pH for inductor 430 and Q of 2.5. Such an ILO has a locking range of 300 MHz with 150 uA of injection current.

In an embodiment, LC-ILO 130 operates reliably around −5 to −7 dBm of optical modulation amplitude (OMA). The optical channel loss may be negligible since the waveguide may be routed within SiPh IC 101, and its length might be on the order of <1 mm. Since it is a clock signal modulating MZI 106, the modulation is the same as in the non-return-to-zero (NRZ) case. The length of MZI 106 may be around 200 µm. With capacitance of MZI 106 of around 2 pF/mm, the total load of the driver may be ≈400 fF. Similar to the TIA, resonant driver 105 for MZI 106 also works on a narrow band clock signal in this case and consumes very little power.

Figure 5A:
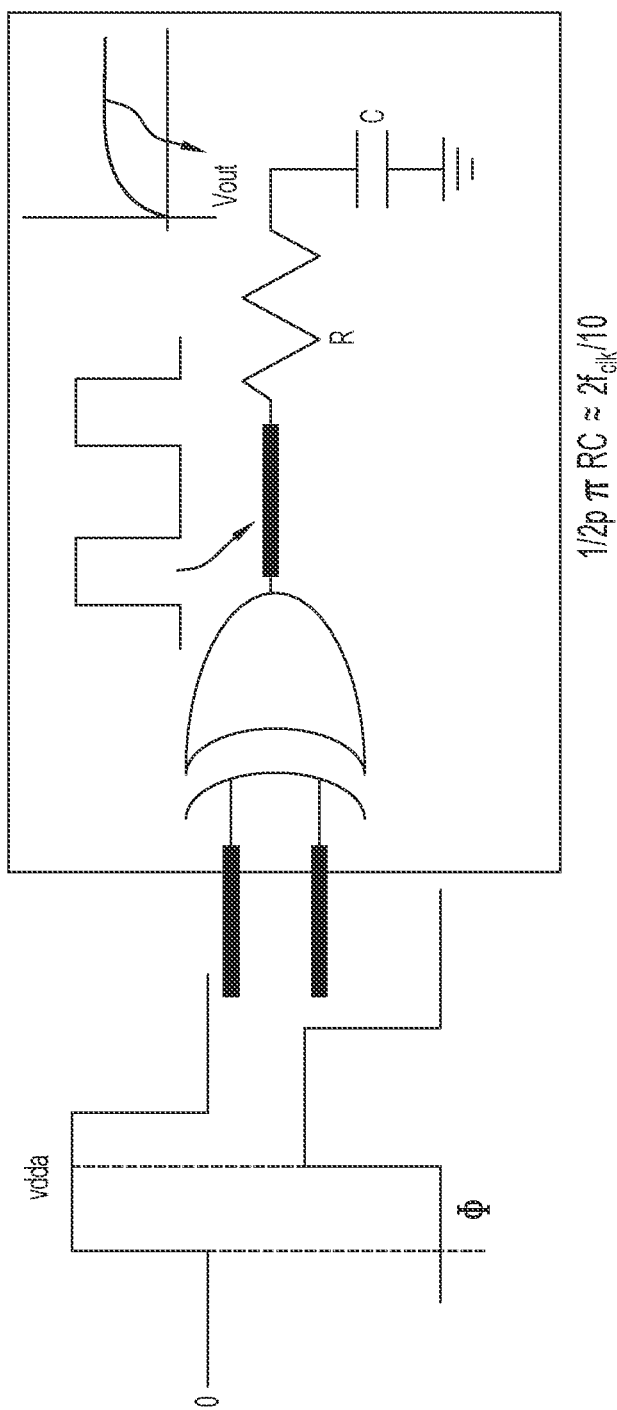
FIG. 5A shows an XOR-based phase detector that may be used in the electro-optical phase noise cancellation system, according to an example embodiment.
Figure 5B:
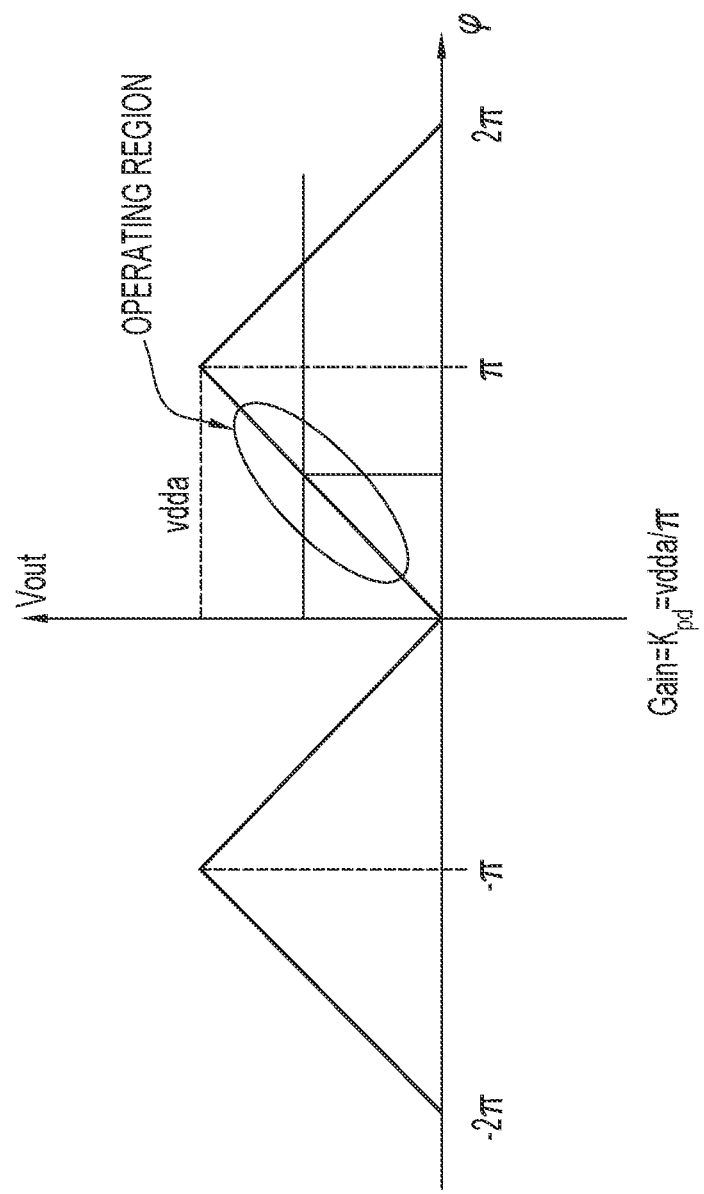
FIG. 5B highlights an operating region of the XOR-based phase detector that may be used in the electro-optical phase noise cancellation system, according to an example embodiment.

FIG. 5A shows an XOR-based phase detector that may be used in system 100, according to an example embodiment. Such a phase detector simplifies the overall design, and also operates easily at high frequencies, e.g., 14 GHz, or other desired frequency. A gain curve of XOR-based differential phase detector 140 is shown in FIG. 5B, with a constant gain across an input phase difference range of π radians (35.7 ps for a 14 GHz clock). A simple first order RC low-pass filter may be used at the output of the XOR phase detector to filter the high-frequency output of the XOR gate and generate an output voltage which is the average of the XOR output as shown in the upper right of FIG. 5A. It is noted that phase detector 140 could also be implemented as, e.g., a phase-frequency-detector or a down-conversion mixer.

As shown in FIG. 1, differential phase detector 140 is followed by filter 150, which has bandpass characteristics, thereby making the loop insensitive to the DC output voltage/operating point of differential phase detector 140. The loop is sensitive only to the low-frequency small-phase perturbations around its operating point.

In order to ensure proper operation of the phase noise cancellation system 100, the differential phase detector 140 is configured to operate around a known operating point across process, voltage, and temperature. In this regard, FIG. 5B highlights an operating region of the XOR-based differential phase detector 140 that may be used in the electro-optical phase noise cancellation system 100.

Figure 6A:
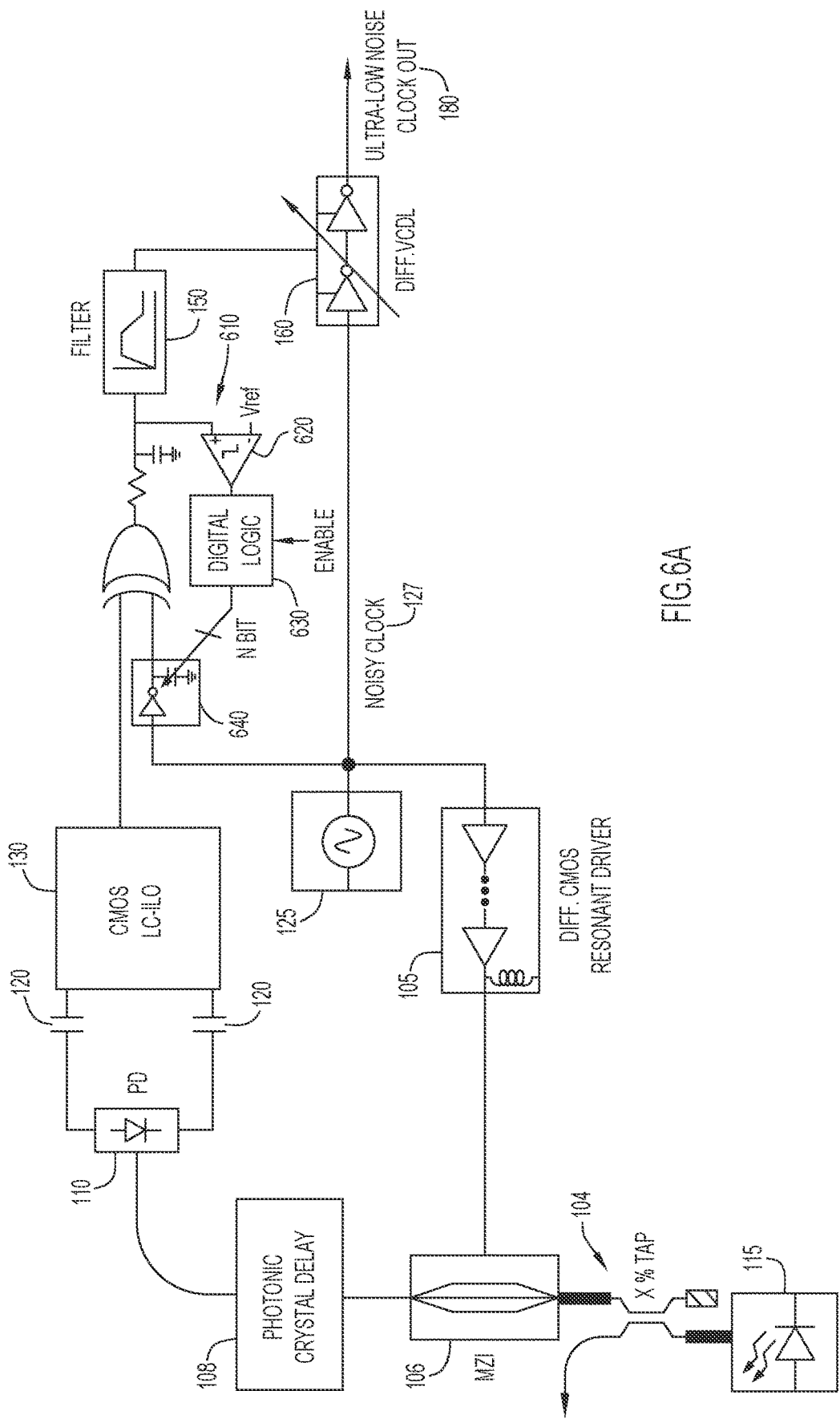
FIG. 6A shows the electro-optical phase noise cancellation system along with a phase detector calibration loop, according to an example embodiment.

In an embodiment, and with reference to FIG. 6A, to ensure an appropriate operating region, a (one-time) calibration loop 610 is built around differential phase detector 140 using a delay locked loop (DLL). Calibration loop 610 includes comparator 620, digital logic 630 and a programmable delay element 640. Since the allowed operating point range is large enough (π), the DLL can be turned off after a one-time calibration, thus enabling calibration loop 610 to be used for just "one-time."

Digital logic 630 may be configured with two main components, a SAR logic that provides an N bit digital control word for the programmable delay element 640 disposed before the XOR logic of differential phase detector 140 to ensure that output DC operating point is Vref (e.g., vdda/2), and XOR "Gain-sign-extraction" logic to check if the gain of the XOR is +vdda/π or −vdda/π. Once the calibration loop 610 settles, digital logic 630 can be turned off to save power and avoid any additional noise.

Figure 6B:
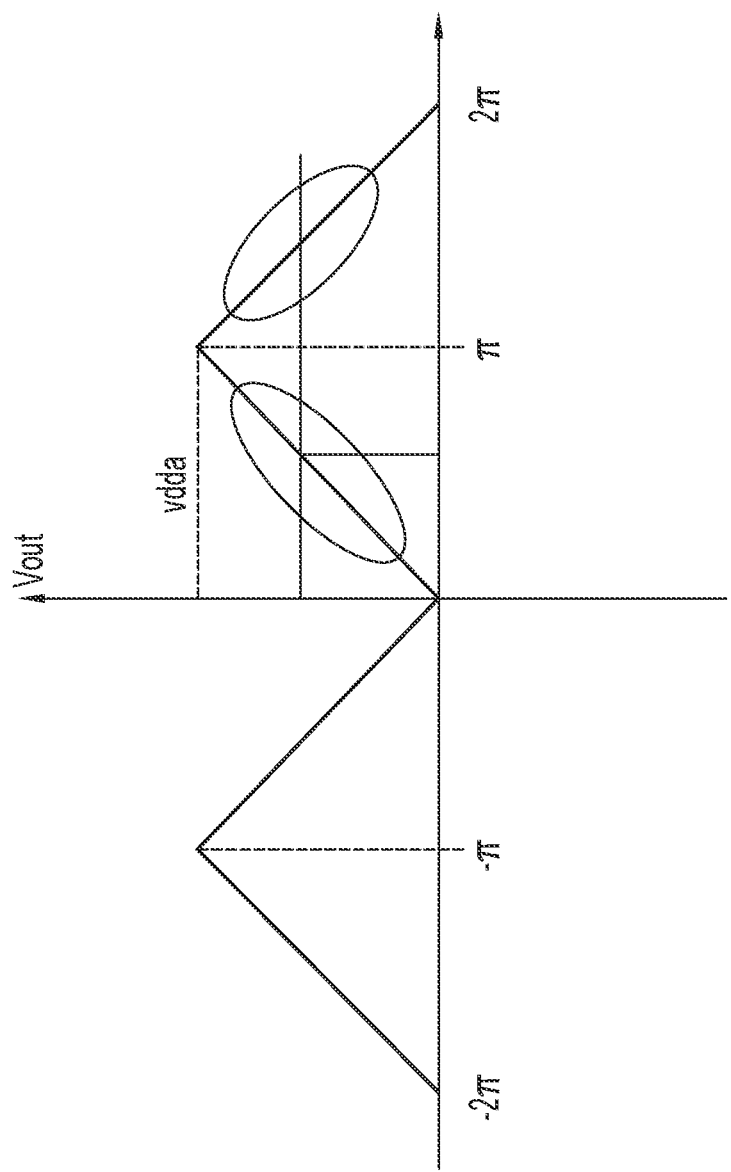
FIG. 6B show operating regions of the XOR-based phase detector that may be used in the electro-optical phase noise cancellation system, according to an example embodiment.

FIG. 6B show potential operating regions of the XOR-based differential phase detector 140 that may be used in system 100, according to an example embodiment, in view of the calibration loop 610.

Figure 7:
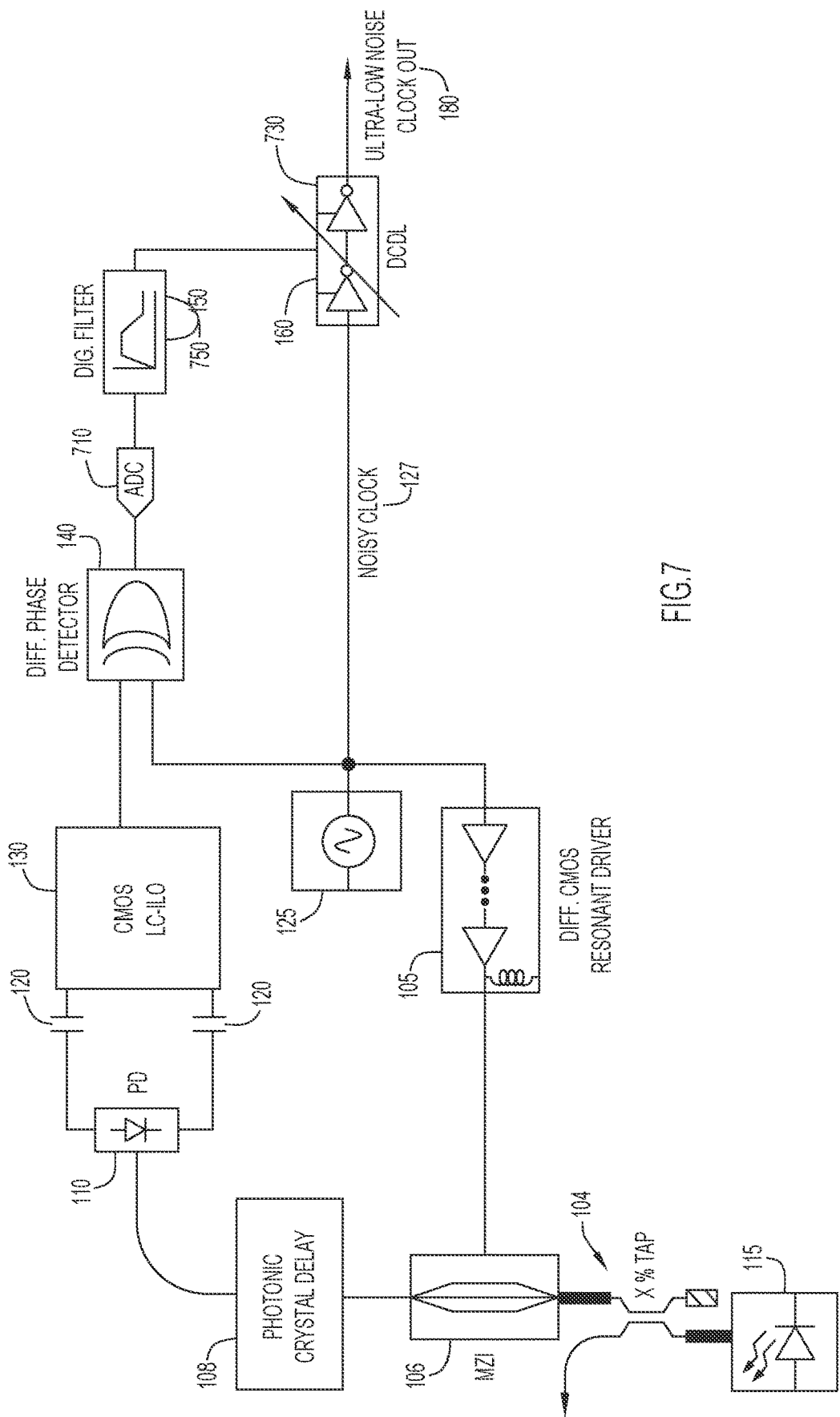
FIG. 7 shows another embodiment of the electro-optical phase noise cancellation system including a digital filter, according to an example embodiment.

FIG. 7 shows another embodiment of the electro-optical phase noise cancellation system including a digital filter, according to an example embodiment. As noted earlier, filter 150 can also be implemented as a digital filter 750. An ADC 710 can be used to convert the analog voltage at the output of the phase detector 140. In this case, H(s) can be implemented in the digital domain and the digital output can be used to control a digitally controlled delay line (DCDL) 730. A more complex higher order filter can be implemented in this scenario. In some cases, the DCDL 730 is also known as a digital to time converter (DTC).

Figure 8A:
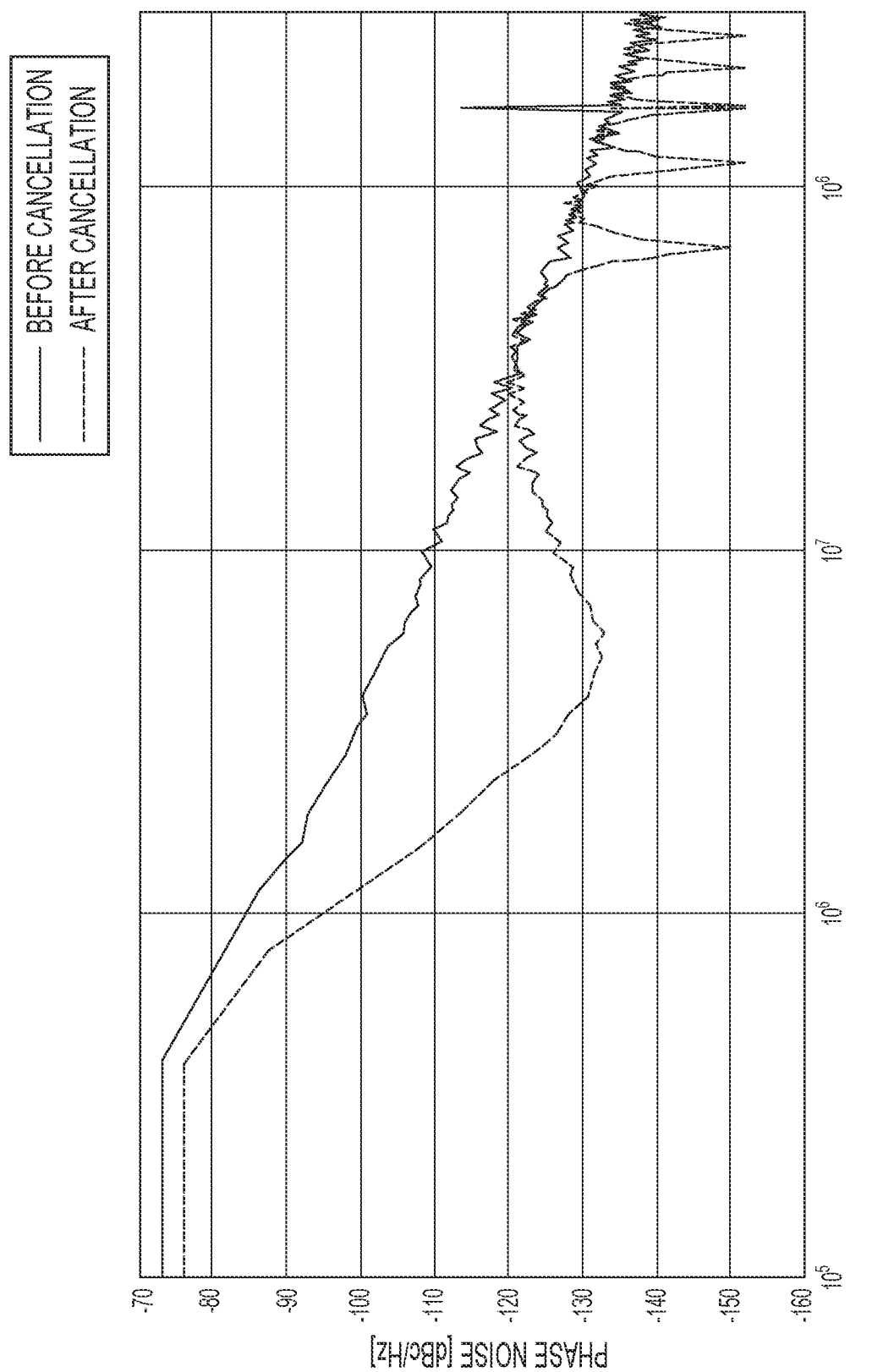
FIG. 8A is a graph comparing phase noise of a ring oscillator-based PLL before and after noise cancellation, according to an example embodiment.

FIG. 8A is a graph comparing simulated phase noise of a ring oscillator-based PLL before and after noise cancellation, according to an example embodiment, and FIG. 8B is a graph comparing simulated phase noise of an LC oscillator-based PLL before and after noise cancellation, according to an example embodiment. In the simulations, a photonic crystal based optical delay of 20 ns was used, and the gains of the differential phase detector 140, filter 150 (with H(s) transfer function), and delay line are set such that maximum noise cancellation from 1 M-20 MHz is achieved. As can be seen, up to 40 dB of phase noise cancellation is observed, and total integrated jitter (2 MHz-100 MHz) is reduced by 4.7 times.

Figure 9A:
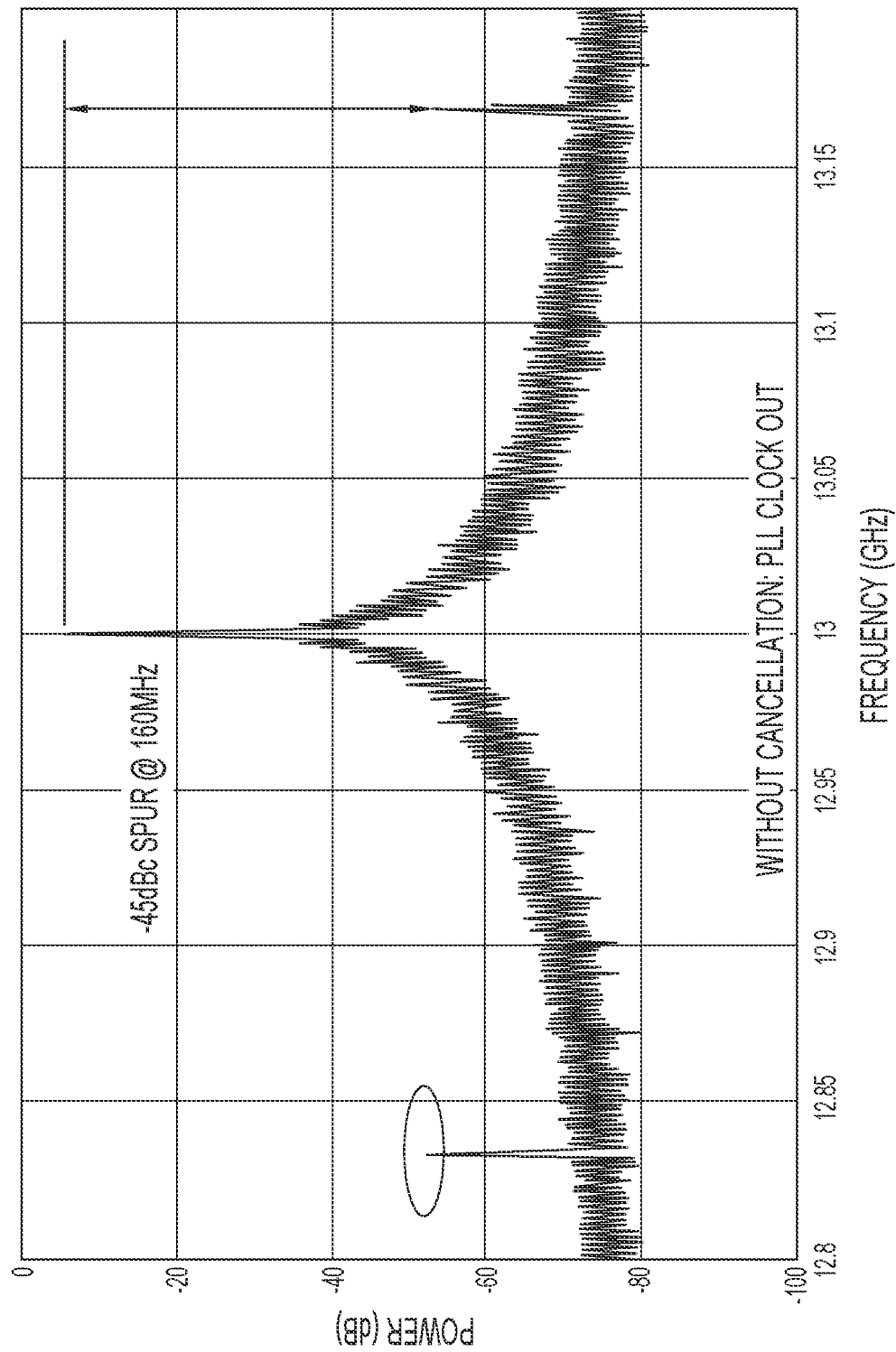
FIG. 9A is a graph showing a frequency spectrum with spurious tones without the benefit of the noise cancellation technique described herein.

FIG. 9A is an example graph showing a frequency spectrum with spurious tones at 160 MHz from the center frequency, without the benefit of the noise cancellation technique described herein.

Figure 9B:
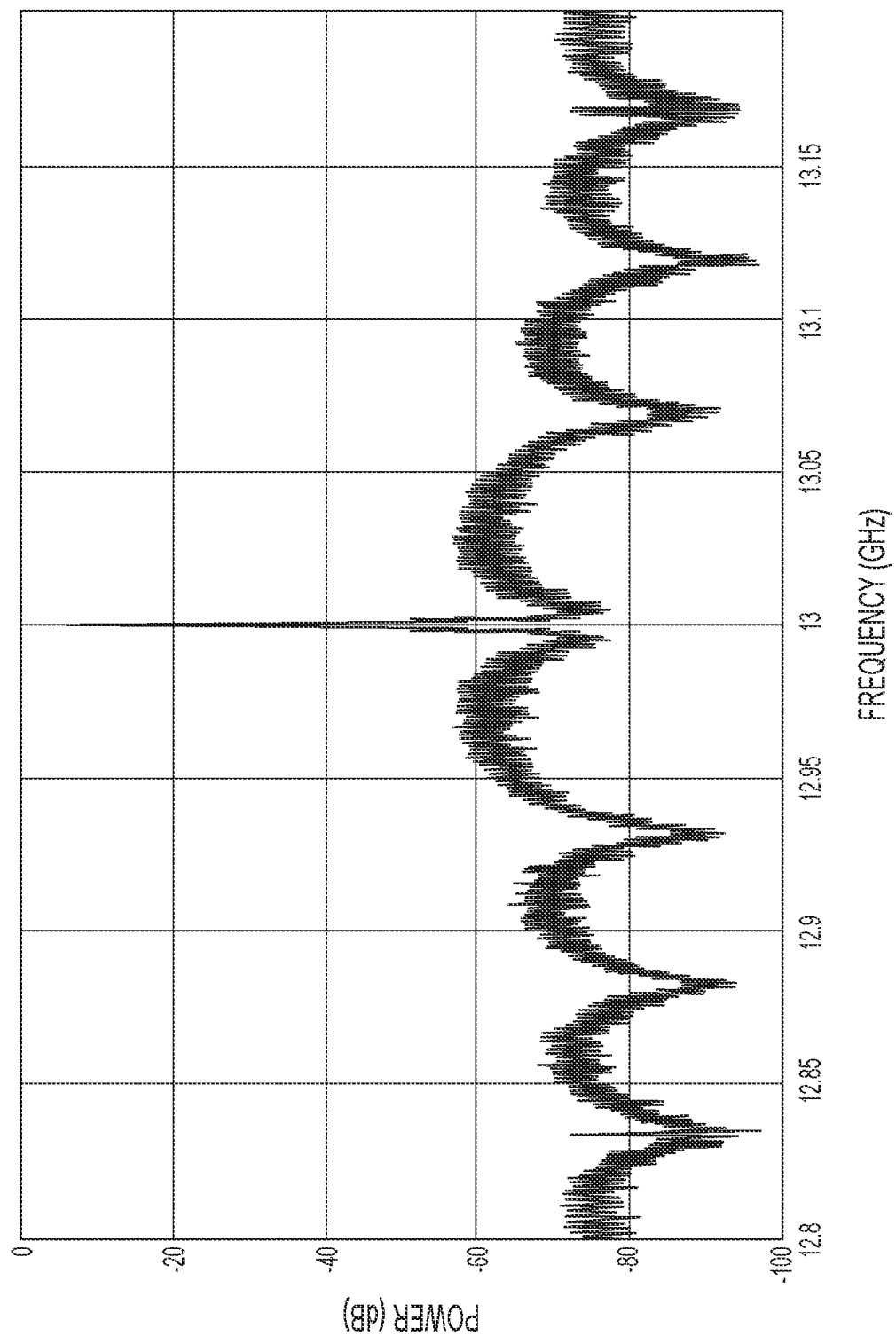
FIG. 9B is a graph showing a frequency spectrum without the spurious tones in view of the noise cancellation technique described herein.

FIG. 9B is a graph showing a frequency spectrum with reduced spurious tones in view of the noise cancellation technique described herein. With the notches in the transfer function of filter 150 close to $@=(2n+1)\pi/Td$, the optical delay can be configured such that the notch falls exactly at the spurious tone frequencies of the clock. The spurious tones can either come from the reference crystal clock or from any undesired coupling inside the electrical chip. In this example, a reference clock spur at 160 MHz at the PLL output is effectively cancelled.

Figure 10:
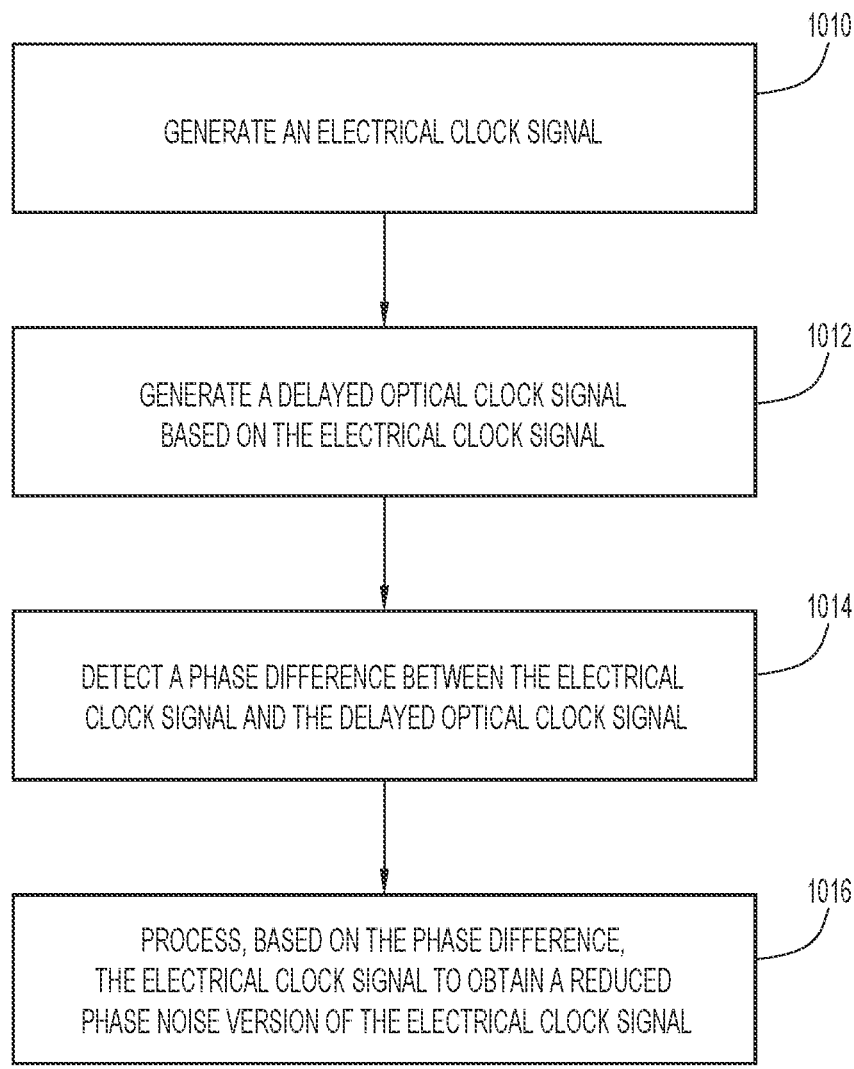
FIG. 10 is a flow chart depicting a series of operations for performing phase noise reduction or cancellation, according to an example embodiment.

FIG. 10 is a flow chart depicting a series of operations for performing phase noise reduction or cancellation, according to an example embodiment. At 1010, an operation is configured to generate an electrical clock signal. At 1012, an operation is configured to generate a delayed optical clock signal based on the electrical clock signal. At 1014, an operation is configured to detect a phase difference between the electrical clock signal and the delayed optical clock signal. And at 1016, an operation is configured to process, based on the phase difference, the electrical clock signal to obtain a reduced phase noise version of the electrical clock signal.

Figure 11:
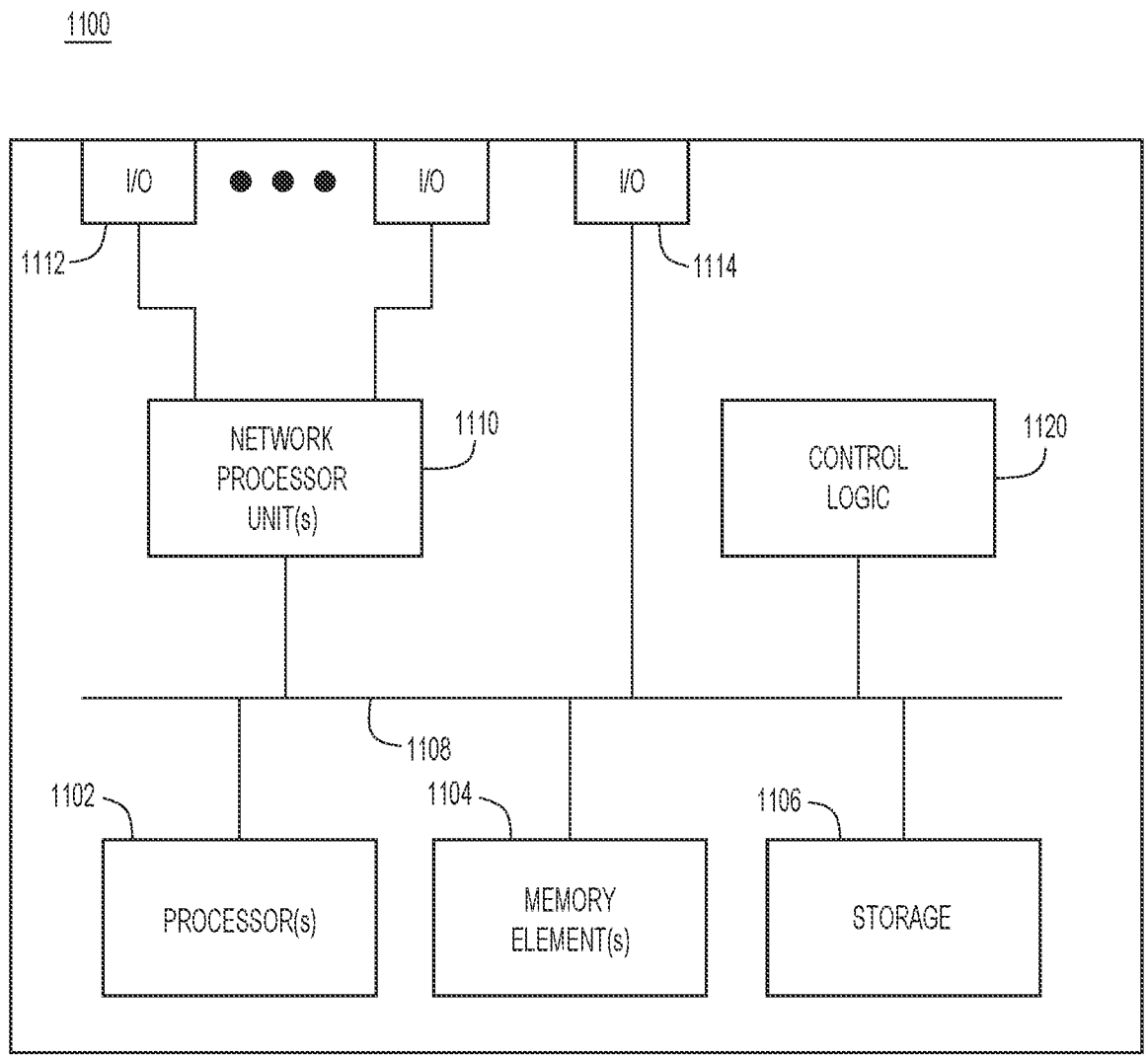
FIG. 11 is a block diagram of a computing device that may benefit from an optical transceiver that employs the phase noise cancellation techniques described herein.

FIG. 11 is a block diagram of a computing device that may benefit from an optical transceiver that employs the phase noise cancellation techniques described herein. In various embodiments, a computing device, such as computing device 1100 or any combination of computing devices 1100, may be configured as any entity/entities as discussed for the techniques depicted in connection with FIGS. 1-10 in order to perform operations of the various techniques discussed herein.

In at least one embodiment, the computing device 1100 may include one or more processor(s) 1102, one or more memory element(s) 1104, storage 1106, a bus 1108, one or more network processor unit(s) 1110 interconnected with one or more network input/output (I/O) interface(s) 1112, one or more I/O interface(s) 1114, and control logic 1120. In various embodiments, instructions associated with logic for computing device 1100 can overlap in any manner and are not limited to the specific allocation of instructions and/or operations described herein.

In at least one embodiment, processor(s) 1102 is/are at least one hardware processor configured to execute various tasks, operations and/or functions for computing device 1100 as described herein according to software and/or instructions configured for computing device 1100. Processor(s) 1102 (e.g., a hardware processor) can execute any type of instructions associated with data to achieve the operations detailed herein. In one example, processor(s) 1102 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1104 and/or storage 1106 is/are configured to store data, information, software, and/or instructions associated with computing device 1100, and/or logic configured for memory element(s) 1104 and/or storage 1106. For example, any logic described herein (e.g., control logic 1120) can, in various embodiments, be stored for computing device 1100 using any combination of memory element(s) 1104 and/or storage 1106. Note that in some embodiments, storage 1106 can be consolidated with memory element(s) 1104 (or vice versa) or can overlap/exist in any other suitable manner.

In at least one embodiment, bus 1108 can be configured as an interface that enables one or more elements of computing device 1100 to communicate in order to exchange information and/or data. Bus 1108 can be implemented with any architecture designed for passing control, data and/or information between processors, memory elements/storage, peripheral devices, and/or any other hardware and/or software components that may be configured for computing device 1100. In at least one embodiment, bus 1108 may be implemented as a fast kernel-hosted interconnect, potentially using shared memory between processes (e.g., logic), which can enable efficient communication paths between the processes.

In various embodiments, network processor unit(s) 1110 may enable communication between computing device 1100 and other systems, entities, etc., via network I/O interface(s) 1112 (wired and/or wireless) to facilitate operations discussed for various embodiments described herein. In various embodiments, network processor unit(s) 1110 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 1100 and other systems, entities, etc. to facilitate operations for various embodiments described herein. In various embodiments, network I/O interface(s) 1112 can be configured as one or more Ethernet port(s), Fibre Channel ports, any other I/O port(s), and/or antenna(s)/antenna array(s) now known or hereafter developed. Thus, the network processor unit(s) 1110 and/or network I/O interface(s) 1112 may include suitable interfaces for receiving, transmitting, and/or otherwise communicating data and/or information in a network environment.

I/O interface(s) 1114 allow for input and output of data and/or information with other entities that may be connected to computing device 1100. For example, I/O interface(s) 1114 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1120 can include instructions that, when executed, cause processor(s) 1102 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein, if any, (e.g., control logic 1120) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1104 and/or storage 1106 can store data, software, code, instructions (e.g., processor instructions), logic, parameters, combinations thereof, and/or the like used for operations described herein. This includes memory element(s) 1104 and/or storage 1106 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In sum, in one embodiment a method is provided. The method may include generating an electrical clock signal, generating a delayed optical clock signal based on the electrical clock signal, detecting a phase difference between the electrical clock signal and the delayed optical clock signal, and processing, based on the phase difference, the electrical clock signal to obtain a reduced phase noise version of the electrical clock signal.

In the method, generating the delayed optical clock signal may include passing an optical signal, generated based on the electrical clock signal, through a photonic crystal resonator.

In the method, generating the delayed optical clock signal may include passing the optical signal through a cascaded add-drop filter based on the photonic crystal resonator.

In the method, generating the delayed optical clock signal may include modulating the optical signal using a resonant driver and a Mach-Zehnder Interferometer.

The method may also include tapping a laser light source as an input to the Mach-Zehnder Interferometer.

The method may also include detecting the phase difference between the electrical clock signal and the delayed optical clock signal using an XOR-based phase detector.

The method may also include calibrating the XOR-based phase detector with a calibration loop.

In the method, processing the electrical clock signal to obtain a reduced noise version of the electrical clock signal may include controlling a voltage-controlled delay line based on a signal representative of the phase difference.

In the method, the reduced phase noise version of the electrical clock signal may include reduced spurious tones compared to the electrical clock signal.

In another embodiment, a method may include generating a clock signal, modulating an optical signal based on the clock signal to obtain a modulated optical signal, delaying the modulated optical signal to obtain a delayed modulated optical signal, converting the delayed modulated optical signal to an electrical signal, detecting a phase difference between the electrical signal and the clock signal, and processing, based on the phase difference, the clock signal to obtain a reduced phase noise version of the clock signal.

The method may also include filtering a signal representative of the phase difference.

In the method, delaying the modulated optical signal to obtain a delayed modulated optical signal may include passing a modulated optical signal through a photonic crystal resonator.

In still another embodiment, a device includes a clock configured to generate a clock signal, an optical modulator configured to modulate an optical signal based on the clock signal to obtain a modulated optical signal, an optical delay configured to delay the modulated optical signal to obtain a delayed modulated optical signal, a photo detector configured to convert the delayed modulated optical signal to an electrical signal, a phase detector configured to detect a phase difference between the electrical signal and the clock signal, and a voltage controlled delay line configured to process, based on the phase difference, the clock signal to obtain a reduced phase noise version of the clock signal.

The device may also include a filter configured to filter a signal representative of the phase difference.

In the device, the optical modulator may include a Mach-Zehnder Interferometer, and the device may further include a resonant driver configured to drive the Mach-Zehnder Interferometer.

The device may also include an optical tap configured to tap a laser light source as an input to the Mach-Zehnder Interferometer.

In the device, the phase detector may be implemented as a phase-frequency-detector or a down-conversion mixer.

In the device, the optical delay may be implemented as a cascaded add-drop filter based on a photonic crystal resonator.

In the device, the phase detector may be implemented as an XOR-based phase detector.

The device may further include a calibration loop to calibrate the XOR-based phase detector.

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method comprising:
generating an electrical clock signal;
generating, using a photonic crystal resonator in a photonics integrated circuit, a delayed optical clock signal based on the electrical clock signal;
detecting a phase difference between the electrical clock signal and the delayed optical clock signal; and
processing, based on the phase difference, the electrical clock signal to obtain a reduced phase noise version of the electrical clock signal.

2. The method of claim 1, wherein generating the delayed optical clock signal comprises passing an optical signal, generated based on the electrical clock signal, through the photonic crystal resonator.

3. The method of claim 2, wherein generating the delayed optical clock signal comprises passing the optical signal through a cascaded add-drop filter based on the photonic crystal resonator.

4. The method of claim 2, wherein generating the delayed optical clock signal comprises modulating the optical signal using a resonant driver and a Mach-Zehnder Interferometer.

5. The method of claim 4, further comprising tapping a laser light source as an input to the Mach-Zehnder Interferometer.

6. The method of claim 1, further comprising detecting the phase difference between the electrical clock signal and the delayed optical clock signal using an XOR-based phase detector.

7. The method of claim 6, further comprising calibrating the XOR-based phase detector with a calibration loop.

8. The method of claim 1, wherein processing the electrical clock signal to obtain a reduced noise version of the electrical clock signal comprises controlling a voltage-controlled delay line based on a signal representative of the phase difference.

9. The method of claim 1, wherein the reduced phase noise version of the electrical clock signal comprises reduced spurious tones compared to the electrical clock signal.

10. A method comprising:
generating a clock signal;
modulating an optical signal based on the clock signal to obtain a modulated optical signal;
delaying, using a photonic crystal resonator in a photonics integrated circuit, the modulated optical signal to obtain a delayed modulated optical signal;
converting the delayed modulated optical signal to an electrical signal;
detecting a phase difference between the electrical signal and the clock signal; and
processing, based on the phase difference, the clock signal to obtain a reduced phase noise version of the clock signal.

11. The method of claim 10, further comprising filtering a signal representative of the phase difference.

12. The method of claim 10, wherein delaying the modulated optical signal to obtain a delayed modulated optical signal comprises passing a modulated optical signal through the photonic crystal resonator.

13. A device comprising:
a clock configured to generate a clock signal;
an optical modulator configured to modulate an optical signal based on the clock signal to obtain a modulated optical signal;
an optical delay comprising a photonic crystal resonator disposed in a photonics integrated circuit, configured to delay the modulated optical signal to obtain a delayed modulated optical signal;
a photo detector configured to convert the delayed modulated optical signal to an electrical signal;
a phase detector configured to detect a phase difference between the electrical signal and the clock signal; and
a voltage controlled delay line configured to process, based on the phase difference, the clock signal to obtain a reduced phase noise version of the clock signal.

14. The device of claim 13, further comprising a filter configured to filter a signal representative of the phase difference.

15. The device of claim 13, wherein the optical modulator comprises a Mach-Zehnder Interferometer, and the device further comprises a resonant driver configured to drive the Mach-Zehnder Interferometer.

16. The device of claim 15, further comprising an optical tap configured to tap a laser light source as an input to the Mach-Zehnder Interferometer.

17. The device of claim 13, wherein the phase detector comprises a phase-frequency-detector or a down-conversion mixer.

18. The device of claim 13, wherein the optical delay is implemented as a cascaded add-drop filter based on the photonic crystal resonator.

19. The device of claim 13, wherein the phase detector comprises an XOR-based phase detector.

20. The device of claim 19, further comprising a calibration loop to calibrate the XOR-based phase detector.

* * * * *